US008092985B2

(12) United States Patent
Fyson et al.

(10) Patent No.: US 8,092,985 B2
(45) Date of Patent: Jan. 10, 2012

(54) METHOD OF MAKING A PLANOGRAPHIC PRINTING PLATE

(75) Inventors: John R. Fyson, London (GB); John M. Higgins, Cambridge (GB)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/621,589

(22) Filed: Nov. 19, 2009

(65) Prior Publication Data

US 2010/0159394 A1   Jun. 24, 2010

(30) Foreign Application Priority Data

Dec. 18, 2008   (GB) .................................. 0823025.2

(51) Int. Cl.
*G03F 7/00* (2006.01)
*G03F 7/26* (2006.01)

(52) U.S. Cl. ........................ 430/302; 101/453; 101/463.1
(58) Field of Classification Search ................... 430/320, 430/322
See application file for complete search history.

(56) References Cited

U.S. PATENT DOCUMENTS

| 4,202,697 | A | * | 5/1980 | Van Goethem et al. | ...... 430/306 |
| 4,255,513 | A | * | 3/1981 | Laridon et al. | ............ 430/281.1 |
| 6,045,964 | A |  | 4/2000 | Ellis et al. |  |
| 6,194,122 | B1 | * | 2/2001 | Ichikawa et al. | ........... 430/272.1 |
| 6,232,034 | B1 |  | 5/2001 | Kasai et al. |  |
| 6,833,225 | B2 |  | 12/2004 | Ooishi |  |
| 6,976,426 | B2 |  | 12/2005 | McLean et al. |  |
| 7,032,514 | B2 |  | 4/2006 | Mori et al. |  |
| 7,252,923 | B2 |  | 8/2007 | Kobayashi |  |
| 2008/0085478 | A1 |  | 4/2008 | Kobayashi et al. |  |

FOREIGN PATENT DOCUMENTS

JP    10-250027    9/1998
JP    11-305422    11/1999

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

The invention relates to a method of making a planographic printing plate comprising a substrate having thereon one or more layers of a radiation-sensitive metal oxide, sulfide or nitride and excluding an organic hydrophobic material or a binder within or above a radiation-sensitive layer, the method comprising depositing the one or more layers of the radiation-sensitive metal oxide, sulfide or nitride by vapor deposition and exposing the one or more layers without that exposure causing ablative effect. Preferably the compound, and in particular a metal oxide, such as titanium dioxide, is deposited by atomic layer deposition at atmospheric pressure and at a temperature of from 20° C. to 300° C. at a layer thickness of less than 100 nm. The substrate can be any planar material, preferably with the potential to be flexible and with a surface that can be roughened or textured. No binder is required to adhere the metal compound to the printing plate and no processing or chemicals are required in the preparation of the plate.

10 Claims, 5 Drawing Sheets

METHOD OF MAKING A PLANOGRAPHIC PRINTING PLATE

FIELD OF THE INVENTION

The invention relates to a method of making a planographic printing plate, and in particular a lithographic printing plate, by vapour deposition of a radiation-sensitive compound on a substrate therefore. The radiation-sensitive compound is a metal sulfide, nitride or preferably a metal oxide, preferably applied by atomic layer deposition.

BACKGROUND OF THE INVENTION

Offset lithography is the one of the most widely used forms of printing and is characterized by having the image and non-image areas in the same plane (planographic). The image and non-image areas have different wetting characteristics such that, on press, the hydrophilic (water-loving) non-image areas of the printing plate are wetted by water or a dampening solution and only the hydrophobic or oleophilic (oil-loving) image areas are wetted by ink, which is subsequently transferred or 'offset' onto the surface of a material upon which the image is to be reproduced, such as paper, cloth or plastics, commonly by the use of an intermediate 'blanket' roller.

Many long-run, commercial, planographic printing plates comprise a grained and anodized aluminium layer on which is coated an ink-receptive, hydrophobic layer. Initiating the production of image and non-image areas is usually achieved by selectively exposing the plate to some form of radiation, for example ultra-violet, visible or infra-red radiation. The plate is then processed to remove unwanted, non-image areas of the ink-receptive layer and reveal the appropriate non-image areas of the hydrophilic layer beneath. This can be done in a number of ways, for example, by using a chemical process, by dissolution, by washing, sometimes with some abrasion, or by ablation, all using specific stand-alone devices or performed 'on-press'. It is often necessary to apply a layer of gum to the non-image areas to improve the plate performance. Waterless planographic printing plates use an overlying silicone layer to form the non-image areas, since silicone has a very low surface energy and is not wetted by the special lithographic ink used for waterless printing. In common with the more conventional printing plates, a processing step removes the unwanted material, in this case the selected areas of the silicone layer, to reveal appropriate ink-receptive image areas beneath.

The wetting characteristics of solid surfaces are governed by the chemical properties and the microstructure of the surfaces. It is well-known that both hydrophilic and hydrophobic surface properties can be enhanced by certain levels of surface roughness (see for example, "Physical Chemistry of Surfaces", A. W. Adamson, 5$^{th}$ edition, Wiley & Sons, New York, 1990) and many plates, such as for example those comprising grained and anodized aluminium, rely on such an effect to produce hydrophilic surfaces suitable as non-image areas on lithographic printing plates.

The production of the image and non-image regions prior to printing by the exposure of a plate selectively to some form of radiation can in some cases be based on the use of metal oxides, sulfides or nitrides coated as thin layers onto a suitable substrate. In particular, it is known that some metal oxides, when exposed to ultra-violet light with sufficient energy to promote an electron into the conduction band, become substantially more hydrophilic and hence are 'radiation-sensitive'. In addition, the same exposure process can also result in the destruction of organic materials that are in contact with the metal oxide surface (see for example, "Photocatalytic Purification of Water and Air", D. F. Ollis and H. Al-Ekabi, Proceedings of the First International Conference on TiO$_2$ Photocatalytic Purification and Treatment of Water and Air, London, Ontario, Canada, 1993, Elsevier, Amsterdam). If the organic material is hydrophobic, the resulting difference in wetting characteristics between exposed and unexposed areas may be sufficient to allow lithographic printing to take place.

Examples of the use of such photocatalytic mechanisms for printing plates are described by Suda et al. in a number of patents and applications, including US Patent Publication No. 2005/0092198 and U.S. Pat. Nos. 6,732,654; 6,978,715; 6,637,336; 6,564,713 and 7,205,094. In such cases the photocatalyst layer contains titanium dioxide, preferably with significant anatase form, and the organic hydrophobic material is coated as a separate, overlying layer. These patents disclose different means of applying the particulate photocatalyst and the hydrophobic layer, including the use of Chemical Vapour Deposition, which is a process wherein the photocatalyst is formed in a vapour phase above the substrate and then adheres to the substrate, often as multiple layers. US Patent Publication No. 2005/0092198 discloses that this process should be carried out from 400° C. to 800° C.

Kobayashi et al. describe in US Patent Publication No. 2008/0085478 that a similar titanium dioxide layer structure can be used for a number of applications, including printing. Kobayashi et al. also describe in U.S. Pat. No. 7,252,923 a 'two-part' process, whereby the titanium dioxide photocatalyst layer and organic hydrophobic material are separate elements which are brought into contact temporarily such that, upon selective exposure to ultra-violet radiation, the photocatalyst layer changes the wetting character of the other element. After exposure the two sheets are separated, leaving a printing plate comprising hydrophilic and hydrophobic regions and a photocatalyst element that can be reused.

Kasai et al. in U.S. Pat. No. 6,232,034 discuss the use of anatase titanium oxide particles in a matrix of a hydrophobic material that changes wetting characteristics on exposure to light. Similarly, Akio et al. in JP 11305422 describe photocatalyst particles which become hydrophilic on exposure to light. Ooishi et al. in U.S. Pat. No. 6,833,225 disclose making a printing plate by sputtering titanium dioxide onto pregrained aluminium and then treating this surface with a hydrophobic material.

Riepenhoff et al. in U.S. Pat. No. 6,976,426 describe a process of making a reusable printing form comprising a particulate photocatalyst layer combined with a binder that changes wetting characteristics when exposed to either ultra-violet light or heating. Ikeda et al. in JP 10250027 disclose a printing system that uses a titanium dioxide plate which can be erased by heat, allowing for its reuse. The titanium dioxide used is particulate and forms the major part of the coating, the remaining materials in the coating being unspecified. Mori et al. in U.S. Pat. No. 7,032,514, describe a planographic printing press comprising a printing plate with a photocatalyst layer formed on a heat insulating layer and a means of applying a hydrophobic layer, whereby the wetting characteristics are changed when exposed to either ultra-violet light or an additional heat treatment in the range 40° C. to 200° C.

A different approach from utilizing vapour-deposited metal inorganic layers to make printing plates is disclosed by Ellis et al. in U.S. Pat. No. 6,045,964. In this method the printing member comprising a metal oxide layer is exposed in an imagewise fashion using an infrared laser so as to remove by ablation selected areas to form a printing plate.

Problem to be Solved by the Invention

Most offset lithographic, long-run printing plates use a grained and anodized aluminium substrate as the non-image, hydrophilic surface, but creating such a surface is a costly, complex and energy-intensive industrial operation. The hydrophilic surface is usually coated with an ink-receptive material, parts of which are selectively removed, generally by a heating or curing step at some pre-printing stage, and in some cases the effects from these treatments can be slow to evolve. When chemical processes are used, there is a significant cost and an adverse environmental impact in using the chemicals, some of which are highly alkaline. In other processes large amounts of debris have to be completely and appropriately removed. This can be particularly difficult as often very precise, very fine features must be obtained. Moreover such processes all require the use and maintenance of appropriate additional equipment occupying valuable floor-space and adding to the cost, time and inconvenience required to prepare a printing plate. When a print-run is concluded, the printing plate is discarded and only some of the materials are recycled.

Therefore there is a need for a printing plate that can be manufactured efficiently using any substrate on a large scale with the minimum use of chemicals. There is further a need for a printing plate that can be exposed conveniently, placed on a printing press and used immediately, without the use of any processing chemicals or any processing steps, particularly when the processes are separate from the printing operation, but also when they are performed 'on-press'.

SUMMARY OF THE INVENTION

In accordance with the present invention there is provided a method of making a planographic printing plate comprising a substrate having thereon one or more layers of a radiation-sensitive metal oxide, sulfide or nitride, and excluding an organic hydrophobic material or a binder within or above a radiation-sensitive layer, the method comprising depositing the one or more layers of the radiation-sensitive metal oxide, sulfide or nitride by vapour deposition and exposing the one or more layers to radiation without that exposure causing an ablative effect.

Advantageous Effect of the Invention

The substrate material can be any planar material that needs no treatment other than cleaning before coating. Thus materials, such as plastics, that might be damaged at temperatures when exposed to temperatures higher than 100° C. can be used. In the case of aluminium, there is no need to carry out the expensive and energy-intensive process of graining and anodizing, although this can still be done. No processing or chemicals are required to prepare the printing plates, which can be put on a planographic printing plate and used immediately.

The coating method using vapour deposition, and in particular Atomic Layer Deposition, hereinafter ALD, is fast and of low cost, since only a thin layer of material has to be applied. The apparatus can be scaled to coat any width of substrate and can coat 'roll-to-roll'. The deposition process can be carried out at low temperatures and at atmospheric pressure. The layer deposited is tough and strongly adheres to any substrate and no binder is required. No additional hydrophobic organic material is required above a radiation-sensitive layer as in the most usual large-scale, wide-area layer manufacturing processes. A layer of for example, plastic may however be interposed, if required, between a radiation-sensitive layer and a metal substrate. The manufacture of the metal oxide, sulfide or nitride is carried out simultaneously to the deposition process. Although the afore-mentioned patent literature teaches in the case of titanium dioxide the necessity for it to be in the anatase form, this has been found to be unnecessary for the present invention, since titanium dioxide made at below 200° C., although not anatase, is still efficacious.

BRIEF DESCRIPTION OF THE DRAWINGS

The invention will now be described with reference to the accompanying drawings in which.

DETAILED DESCRIPTION OF THE INVENTION

Figure 1:
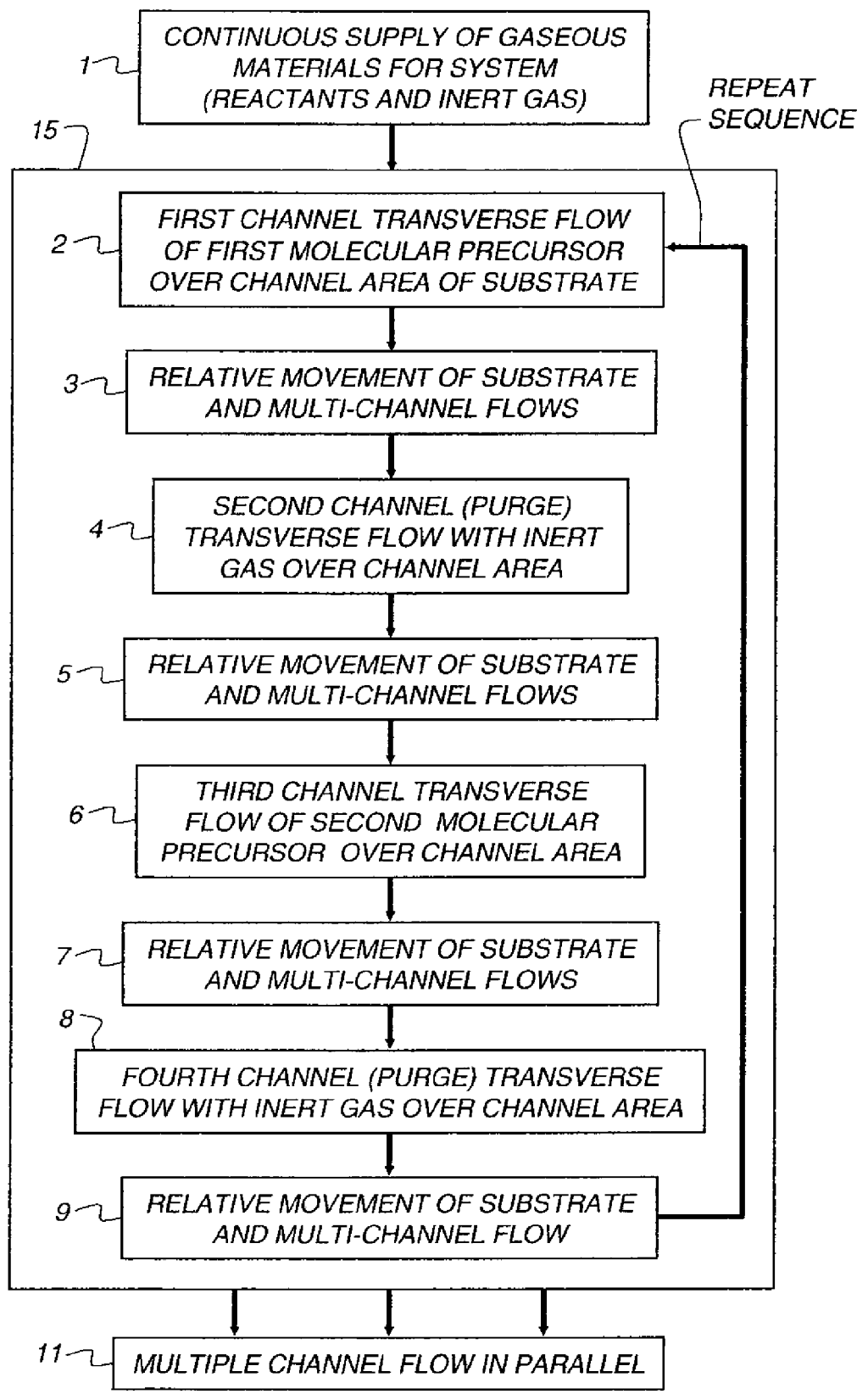
FIG. 1 is a flow chart describing the steps of an atomic layer deposition process used in the present invention.

The method of application of the metal oxide, sulfide or nitride to a substrate to form a planographic printing plate in accordance with this invention is by vapour deposition and preferably by using ALD such as described, for example, by D. H. Levy, D. Freeman, S. F. Nelson, P. J. Cowdery-Corvan, L. M. Irving, Applied Physics Letters, 92, 192101 (2008) and in US Patent Publication Nos. 2007/0238311 and US 2006/0194157, which can be used at atmospheric pressure and can be scaled to any size. The method is carried out at relatively low temperatures, generally from about 20° C. to 300° C., preferably from about 100° C. to 250° C. In addition, the reactions take place on the substrate surface and only one atomic layer of material is applied at a time, such that the metal oxide, sulfide or nitride layer is generally less than 100 nm and preferably less then 25 nm in thickness. The material is essentially planar and continuous and not particulate. In particular no binder or additional hydrophobic material is required to adhere the metal compound to the printing plate.

ALD, sometimes known as atomic layer epitaxy, ALE, and specifically spatial atomic layer deposition, spALD, is a self-limiting, sequential surface chemistry method that deposits conformal thin films of materials onto substrates of varying compositions. ALD is similar in chemistry to Chemical Vapour Deposition, except that the ALD reaction breaks the Chemical Vapour Deposition reaction into two or more partial reactions, keeping the precursor materials separate during the reaction sequence as described by S. M. George in J. Phys. Chem. 1996, 100, 13121-13131, Smith, Donald (1995) "Thin-Film Deposition: Principles and Practice" MacGraw-Hill. ALD can be used to deposit several types of thin films, including various metal oxides, sulfides and nitrides especially those of titanium and in particular titanium dioxide. The printing plate can be made by applying to a substrate one or more layers of a metal oxide, sulfide or nitride that has a high energy band-gap. The hydrophilicity of the one or more metal oxide, sulfide or nitride layers increases on exposure to radiation of sufficient energy to exceed the energy band-gap of the metal compound. The resulting difference in wetting characteristics is sufficient to allow formation of image and non-image areas such that, on a planographic printing press, hydrophilic non-image areas of the printing plate are wetted by water, or a dampening solution, and only the hydrophobic/oleophilic, ink-receptive, image areas are wetted by ink.

Preferably a layer comprises a metal oxide and may be any such oxide that is known to be a photo-semiconductor, such as, for example, zinc oxide (ZnO), tin oxide ($SnO_2$), strontium titanium oxide ($SrTiO_3$), tungsten oxide ($WO_3$), bismuth oxide ($Bi_2O_3$) and iron oxide ($Fe_2O_3$). However titanium dioxide ($TiO_2$) is preferred since it has a high band gap energy, is chemically stable, non-toxic and is readily available.

The substrate can be any planar material, preferably with the potential to be formed such that it is flexible and with a surface that can be roughened or textured. Examples are sheet metals such as aluminium, copper, stainless steel, alloys, and polymers such as polyethylene terephthalate (PET), polyethylene naphthalate (PEN) and polyamide, many types of paper, flexible glass and composites thereof.

FIG. 1 is a generalized step diagram of a process for practicing the present invention. Two reactive gases are used: a first molecular precursor and a second molecular precursor. Gases are supplied from a gas source and can be delivered to the substrate, for example, via a distribution manifold. Metering and valving apparatus for providing gaseous materials to the distribution manifold can be used.

As shown in Step 1, a continuous supply of gaseous materials for the system is provided for depositing a thin film of material on a substrate. The steps in Sequence 15 are sequentially applied. In Step 2, with respect to a given area of the substrate (referred to as the channel area), a first molecular precursor or reactive gaseous material is directed to flow in a first channel transversely over the channel area of the substrate (and substantially parallel to the surface of the substrate) and reacts therewith. In Step 3 relative movement of the substrate and the multi-channel flows in the system occurs, which sets the stage for Step 4, in which a second channel (purge) flow with inert gas occurs over the given channel area. Then, in Step 5, relative movement of the substrate and the multi-channel flows sets the stage for Step 6, in which the given channel area is subjected to ALD in which a second molecular precursor also now transversely flows over the given channel area of the substrate and reacts with the previous layer on the substrate to produce (theoretically) a monolayer of a desired material. In such a process, a first molecular precursor can be a metal-containing compound in gas form (for example, a metallic compound such as titanium tetrachloride) and the material deposited can be a metal-containing compound. Thus the second molecular precursor can be, for example, a non-metallic oxidizing compound or a hydrolyzing compound, such as water.

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multi-channels occurs again, which sets the stage for a repeat sequence, back to Step 2. The cycle is repeated as many times as is necessary to establish a desired film or layer. The steps may be repeated with respect to a given channel area of the substrate, corresponding to the area covered by a flow channel. Meanwhile the various channels are being supplied with the necessary gaseous materials in Step 1. Simultaneous with Sequence 15 in FIG. 1, other adjacent channel areas are being processed simultaneously, which results in multiple channel flows in parallel, as indicated in overall Step 11.

The primary purpose of the second molecular precursor is to condition the substrate surface back towards reactivity with the first molecular precursor. The second molecular precursor also provides material as a molecular gas to combine with one or more metal compounds at the surface, forming compounds such as an oxide, nitride or sulfide with the freshly deposited metal-containing precursor.

The continuous ALD purge does not need to use a vacuum purge to remove a molecular precursor after applying it to the substrate.

Assuming that two reactant gases, AX and BY, are used, when gas AX flow is supplied and flowed over a given substrate area, atoms of the gas AX are chemically adsorbed on a substrate, resulting in a layer of A and a surface of ligand X (associative chemisorptions) (Step 2). Then, the remaining gas AX is purged with an inert gas (Step 4). Then, gas BY is flowed over the surface and a chemical reaction between AX (surface) and BY (gas) occurs, resulting in a molecular layer of AB on the substrate (dissociative chemisorptions) (Step 6). The remaining gas BY and by-products of the reaction are then purged (Step 8). The thickness of the thin film can be increased by repeating the process cycle (Steps 2-9).

Because the film can be deposited one monolayer at a time it tends to be conformal and have uniform thickness.

Figure 2:
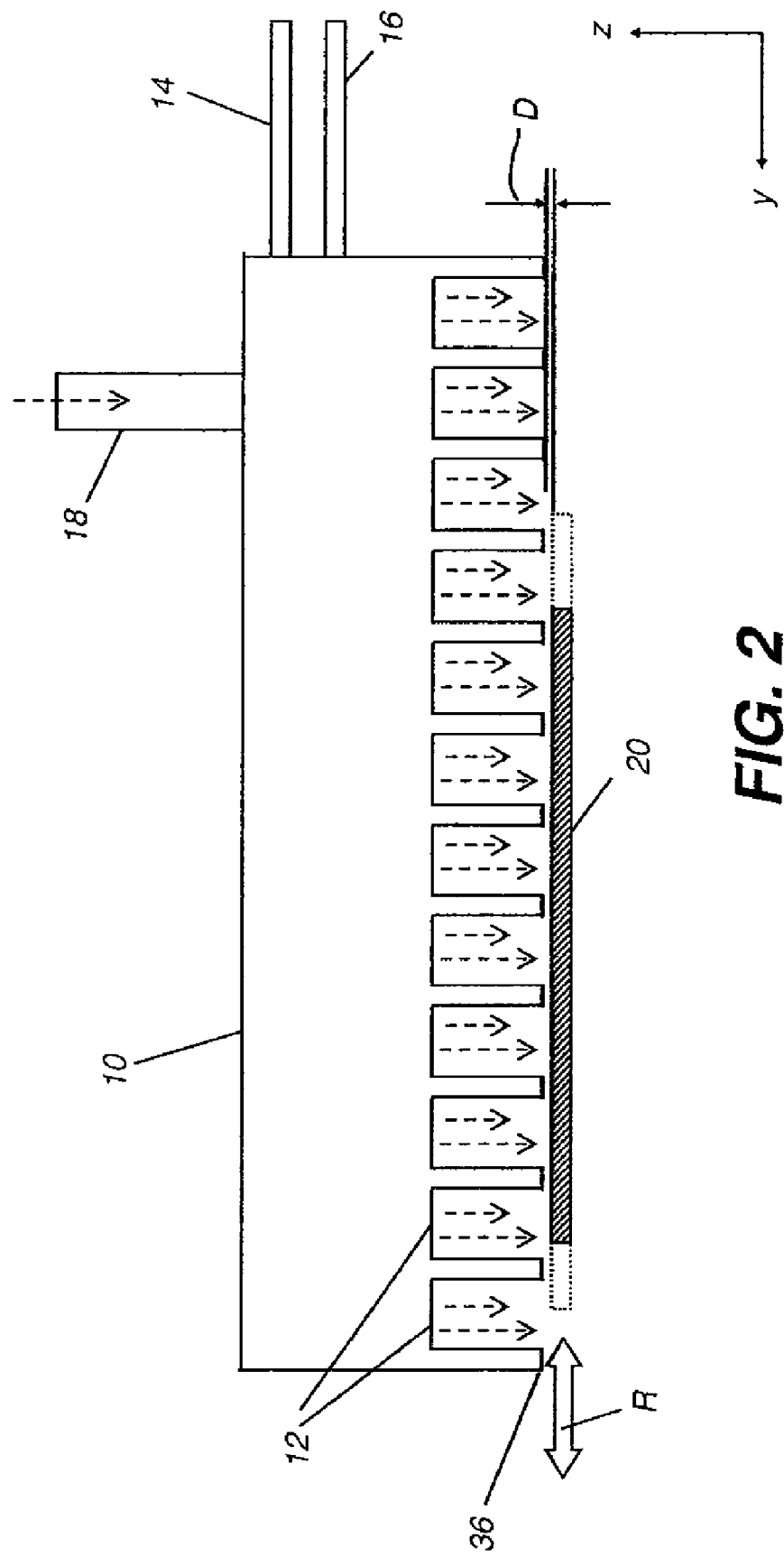
FIG. 2 is a cross-sectional side view of an embodiment of a distribution manifold for atomic layer deposition that can be used in the present process.

Referring now to FIG. 2, there is shown a cross-sectional side view of one embodiment of a distribution manifold 10 that can be used in the present process for ALD onto a substrate 20. Distribution manifold 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement as described below. The arrows in FIG. 2 refer to the diffusive transport of the gaseous material, and not to the flow received from an output channel. The flow is substantially directed out of the page of the Figure.

Gas inlet ports 14 and 16 are adapted to accept first and second gases that react sequentially on the substrate surface to effect ALD deposition, and gas inlet port 18 receives a purge gas that is inert with respect to the first and second gases. Distribution manifold 10 is spaced a distance D from substrate 20, provided on a substrate support. Reciprocating motion can be provided between substrate 20 and distribution manifold 10, either by movement of substrate 20, by movement of distribution manifold 10 or by movement of both substrate 20 and distribution manifold 10. In the particular embodiment shown in FIG. 2, substrate 20 is moved across output face 36 in reciprocating fashion, as indicated by the arrow R and by phantom outlines to the right and left of substrate 20 in FIG. 2. It should be noted that reciprocating motion is not always required for thin-film deposition using distribution manifold 10. Other types of relative motion between substrate 20 and distribution manifold 10 could also be provided, such as movement of either substrate 20 or distribution manifold 10 in one or more directions.

Figure 3:
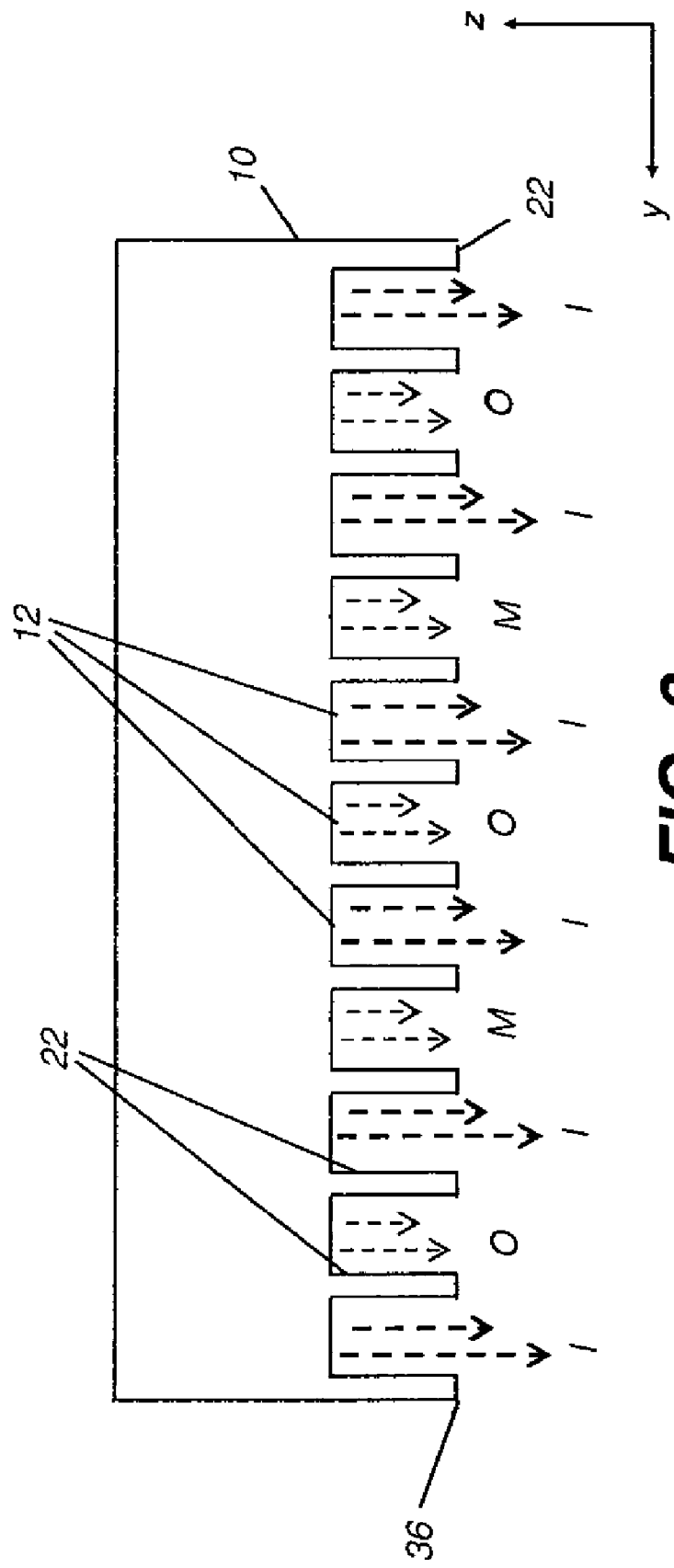
FIG. 3 is a cross-sectional side view of an embodiment of the distribution of gaseous materials to a substrate that is subject to thin film deposition.

The cross-sectional view of FIG. 3 shows gas flows emitted over a portion of front face 36 of distribution manifold 10. In this particular arrangement, each output channel 12 is in gaseous flow communication with one of gas inlet ports 14, 16 or 18 seen in FIG. 2. Each output channel 12 delivers typically a first reactant gaseous material O, or a second reactant gaseous material M, or a third inert gaseous material I.

FIG. 3 shows a relatively basic or simple arrangement of gases. It is possible that a plurality of non-metal deposition precursors (such as material O) or a plurality of metal-containing precursor materials (such as material M) may be delivered sequentially at various ports in a thin-film single deposition. Alternatively a mixture of reactant gases, for example, a mixture of metal precursor materials or a mixture of metal and non-metal precursors, may be applied at a single output channel when making complex thin film materials, for example, those having alternate layers of metals or having lesser amounts of dopants admixed in a metal compound material. The critical requirement is that an inert stream labeled I should separate any reactant channels in which the gases are likely to react with each other. First and second reactant gaseous materials O and M react with each other to effect ALD deposition, but neither reactant gaseous material O nor M reacts with inert gaseous material I.

Figure 4A:
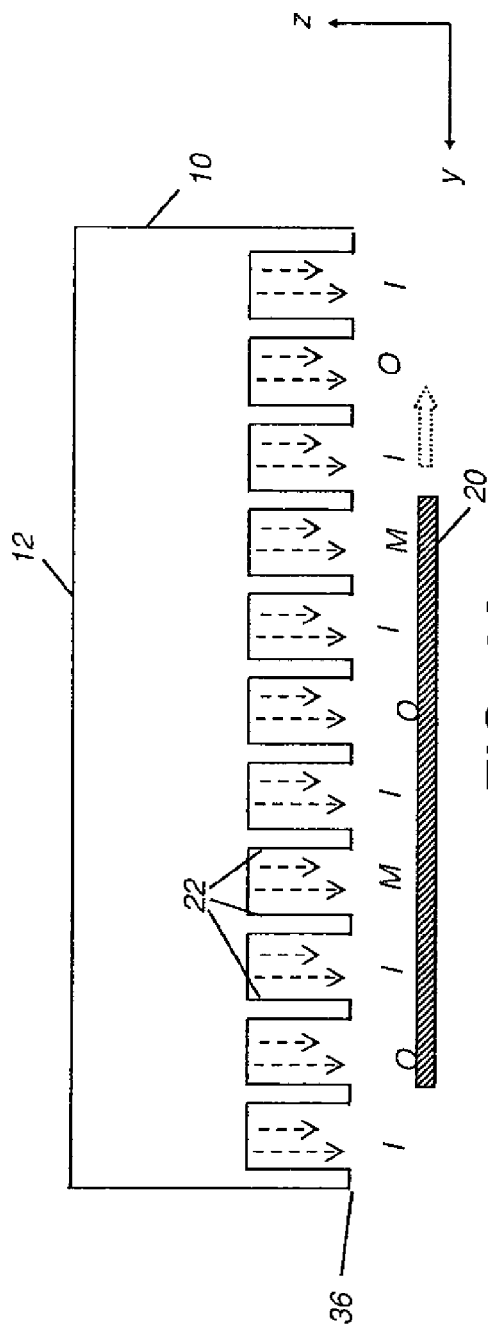
FIGS. 4A and 4B are cross-sectional views of an embodiment of the distribution of gaseous materials schematically showing the accompanying deposition operation.
Figure 4B:
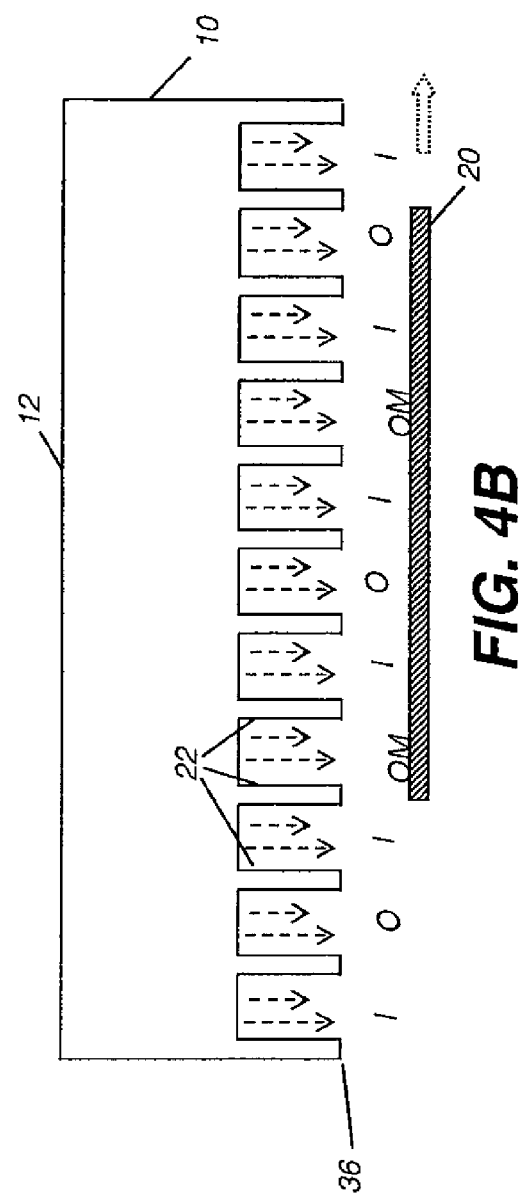

The cross-sectional views of FIGS. 4A and 4B show, in simplified schematic form, the ALD coating operation performed as substrate 20 passes along output face 36 of distribution manifold 10 when delivering reactant gaseous materials O and M. In FIG. 4A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide, sulfide or nitride formed from two reactant gaseous materials.

As FIGS. 4A and 4B show, inert gaseous material I is provided in every alternate output channel 12 between the flows of first and second reactant gaseous materials O and M. Sequential output channels 12 are adjacent, that is, share a common boundary, formed by partitions 22 in the embodiments shown. Here, output channels 12 are defined and separated from each other by partitions 22 that extend perpendicular to the surface of substrate 20.

Notably, there are no vacuum channels interspersed between the output channels 12, i.e. there are no vacuum channels on either side of a channel delivering gaseous materials to draw the gaseous materials around the partitions. This advantageous, compact arrangement is possible because of the innovative gas flow that is used. Unlike gas delivery arrays of earlier processes that apply substantially vertical (i.e. perpendicular) gas flows against the substrate and draw off spent gases in the opposite vertical direction, distribution manifold 10 directs a gas flow (preferably substantially laminar in one embodiment) along the surface for each reactant and inert gas and handles spent gases and reaction by-products in a different manner. The gas flow used in the present invention is directed along and generally parallel to the plane of the substrate surface so that the flow of gases is substantially transverse to the plane of a substrate rather than perpendicular to the substrate being treated.

The patents and publications referred to herein are incorporated by reference in their entirety.

The invention will now be described with reference to the following examples which are, however, in no way to be construed as limiting thereof.

EXAMPLES

In all the examples ALD/CVD coating with titanium oxide was carried out using apparatus similar to that described above, with titanium tetrachloride in one bubbler and water in the other. The flow rate of the carrier gas through the bubblers was 50 ml/min. The flow rate of diluting carrier gas was 200 ml/min. for the water reactant and 150 ml/min. for the titanium tetrachloride. The flow rate of the inert separator gas was 2 l/min. Nitrogen was used for the carrier gas in all instances. A calibration was run to determine the thickness v. number of substrate oscillations. A series of calibration coatings were made for the titanium oxide by coating a series of coatings made with different numbers of oscillations of the substrate under the coating manifold. The thickness of these coatings was determined using an α-SE ellipsometer (Woollam) so that a calibration curve of thickness v. oscillation number could be obtained.

Example 1

A number of coatings of titanium dioxide were deposited onto 1 mm float glass using a spatial ALD device and using the conditions as described above. The layer thickness was approximately 100 nm and the deposition temperature was varied such that samples were obtained at temperatures 100° C., 150° C., 200° C., 250° C., 300° C., 350° C. and 400° C. Half of each sample was exposed to ultra-violet radiation for 20 min. using a Theimer™, 'Spektraproof Daylight'™ contact frame fitted with a 2.5 kW 'metal halogen' bulb at a distance of 1 m through a quartz window (estimated energy of the exposure in the region where titanium dioxide absorbs is 300 mJ/cm$^2$). The static contact angle with 'Millipore' water was measured for both exposed and unexposed regions. The results are shown in TABLE 1.

The presence of sufficient lithographic differential, that is, the sufficient presence of ink-receptive image areas and ink-repelling, water-receptive non-image areas, was tested. The substrate was gently wiped with a piece of cotton wool, which was wetted with lithographic press fount solution (Varn International™ Universal Pink Fount Solution, diluted 1+10 with water). A little black lithographic printing ink (K&E Novastar 908 BIO) was then applied to a cotton pad and the inked cotton pad rubbed gently over the substrate. The results are recorded in TABLE 1.

TABLE 1

| Deposition Temperature (° C.) | Layer Thickness (nm) | Contact angle (exp/unexp) (°) | Lithographic differential |
|---|---|---|---|
| 100 | 100 | 5/44 | Good |
| 150 | 100 | 5/48 | very good |
| 200 | 100 | 5/40 | very good |
| 250 | 100 | 5/47 | very good |
| 300 | 100 | 5/43 | Good |
| 350 | 100 | 5/35 | Poor |
| 400 | 100 | 5/30 | Poor |

TABLE 1 shows that there is a contact angle differential for all coatings made, the differential being greatest for coatings made at temperatures less than 350° C., which showed the best lithographic differential.

Figure 5:
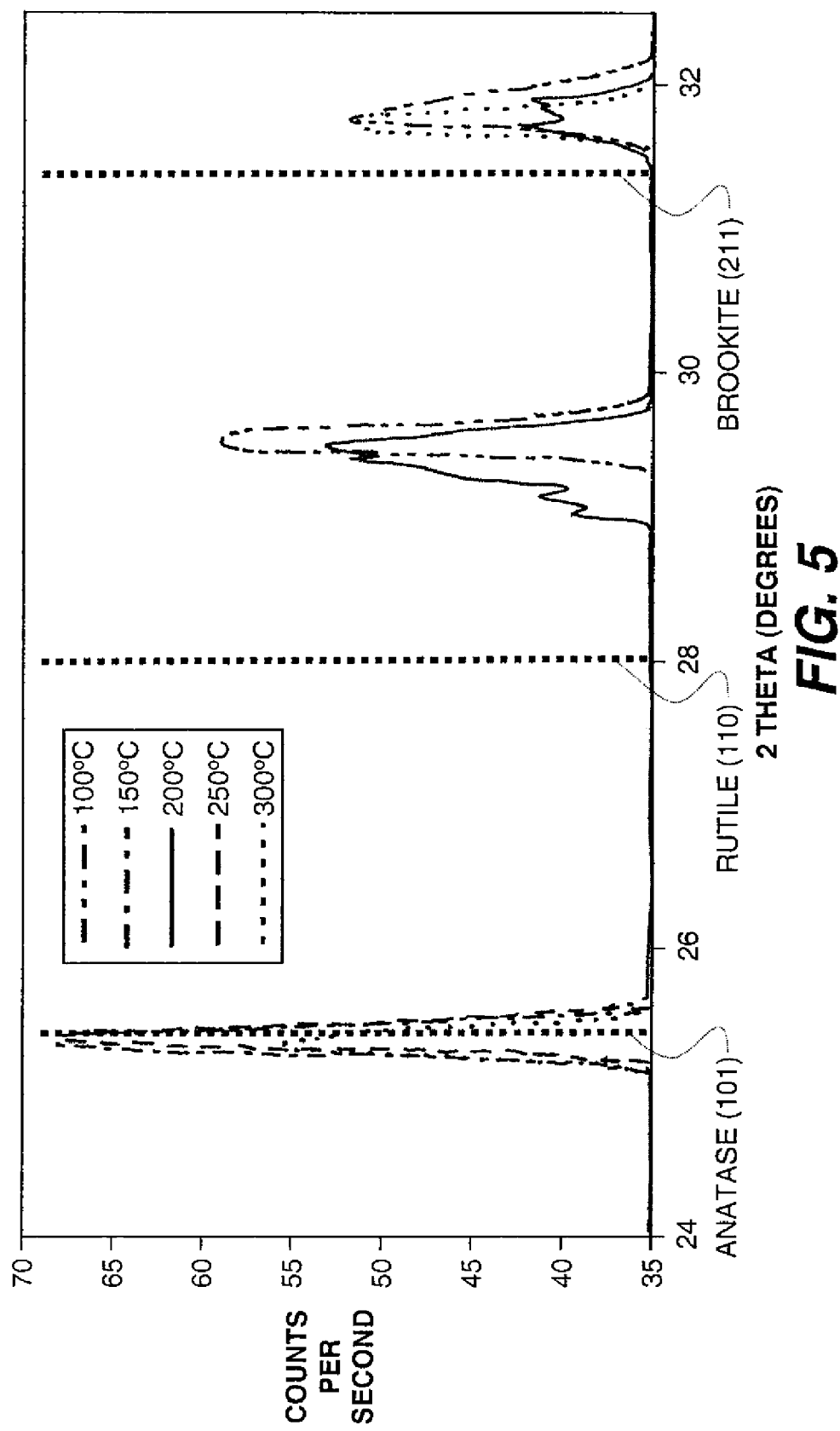
FIG. 5 shows the X-ray diffraction angles of titanium dioxide made at a number of different temperatures. Also included are the expected positions of the different forms of naturally occurring forms of titanium dioxide: anatase (101), rutile (110) and brookite (211). These are compared to those of titanium dioxide, formed by ALD at a number of different temperatures in accordance with the present invention. At 100° C. and 150° C. there is no anatase present in the coating and new forms of titanium dioxide are present that are neither rutile nor brookite.

X-ray diffraction measurements were made on another comparable set of titanium dioxide coatings and the results are shown in FIG. 5. The results show that at high temperatures the coatings were anatase, but they were a different material at lower temperature. This shows that it is unnecessary to have anatase present to see the effect of exposure on contact angle on the titanium dioxide.

Example 2

A number of coatings of titanium dioxide were deposited onto 1 mm float glass using a spatial ALD device and using the conditions as described above at 200° C. and the layer thickness was varied between 12 and 100 nm. Half of each sample was exposed to ultra-violet radiation for 20 min. using a Theimer™, 'Spektraproof Daylight'™ contact frame fitted with a 2.5 kW 'metal halogen' bulb at a distance of 1 m through a quartz window. The static contact angle with 'Millipore' water was measured for both exposed and unexposed regions. The results are shown in TABLE 2.

TABLE 2

| Deposition Temperature (° C.) | Layer Thickness (nm) | Contact angle (exp/unexp) (°) | Lithographic differential |
|---|---|---|---|
| 200 | 12 | 5/47 | Very good |
| 200 | 25 | 5/46 | Very good |
| 200 | 50 | 5/46 | Very good |
| 200 | 100 | 5/48 | Very good |

All the coatings showed sufficient contact angle contrast that would give sufficient lithographic differential to make a printing plate.

Example 3

A coating of titanium dioxide was deposited onto a 0.1 mm thick PEN plastic sheet using a spatial ALD device and using the conditions as described above at 100° C. and the layer thickness was approximately 100 nm. Half of each sample was exposed to ultra-violet radiation for 20 min. using a Theimer™, 'Spektraproof Daylight'™ contact frame fitted with a 2.5 kW 'metal halogen' bulb at a distance of 1 m through a quartz window. The static contact angle with 'Millipore' water was measured for both exposed and unexposed regions.

The ink-up test as described in Example 1 was also carried out. The contact angles were 5° for the exposed portion and 43° for the unexposed area. The sample also showed very good lithographic differential demonstrating that a plate can be made on plastic material at low temperatures.

Example 4

A coating of titanium dioxide was deposited onto a non-anodized, flat, lithographic-grade aluminium sheet using a spatial ALD device and using the conditions as described above at 200° C. and the layer thickness was approximately 100 nm. Half of each sample was exposed to ultra-violet radiation for 20 min. using a Theimer™, 'Spektraproof Daylight'™ contact frame fitted with a 2.5 kW 'metal halogen' bulb at a distance of 1 m through a quartz window. The static contact angle with 'Millipore' water was measured for both exposed and unexposed regions.

The ink-up test as described in Example 1 was also carried out. The contact angles were 5° for the exposed portion and 52° for the unexposed area. The sample also showed very good lithographic differential demonstrating a plate can be made on untreated aluminium material.

The invention has been described in detail with particular reference to certain preferred embodiments thereof, but it will be understood that variations and modifications can be effected within the spirit and scope of the invention.

The invention claimed is:

1. A method of making a planographic printing plate comprising a substrate having thereon one or more layers of a radiation-sensitive metal oxide, sulfide or nitride, and excluding an organic hydrophobic material or a binder within or above a radiation-sensitive layer, the method comprising depositing the one or more layers of the radiation-sensitive metal oxide, sulfide or nitride by atomic layer deposition and exposing the one or more layers to radiation without that exposure causing ablative effect.

2. The method according to claim 1 whereby the atomic layer deposition takes place at atmospheric pressure.

3. The method according to claim 1 whereby the method takes place at a temperature from 20° C. to 300° C.

4. The method according to claim 1 wherein a metal oxide, sulfide or nitride layer is less than 100 nm thick.

5. The method as claimed in claim 4 wherein a metal oxide, sulfide or nitride layer is less than 25 nm thick.

6. The method according to claim 1 wherein the radiation-sensitive layer comprises a metal oxide.

7. The method according to claim 6 where the metal oxide is selected from the class consisting of titanium dioxide, zinc oxide, tin oxide, strontium titanium oxide, tungsten oxide, bismuth oxide and iron oxide.

8. The method according to claim 6 where the metal oxide is titanium dioxide that is prepared from a titanium tetrachloride precursor.

9. The method according to claim 1 wherein the substrate is a metal sheet selected from the group consisting of aluminium, grained and/or anodized aluminum, copper, stainless steel or an alloy thereof.

10. The method of claim 1 wherein the substrate is polyethylene terephthalate, polyethylene naphthalate, polyamide, paper, flexible glass, or a composite thereof.

* * * * *